United States Patent [19]

Lin

[11] Patent Number: 5,750,013

[45] Date of Patent: May 12, 1998

[54] ELECTRODE MEMBRANE ASSEMBLY AND METHOD FOR MANUFACTURING THE SAME

[75] Inventor: Andrew S. Lin, Hsinchu, Taiwan

[73] Assignee: Industrial Technology Research Institute, Taiwan

[21] Appl. No.: 689,493

[22] Filed: Aug. 7, 1996

[51] Int. Cl.$^6$ .......................... C23C 16/26; C23C 16/50
[52] U.S. Cl. ............... 204/192.14; 427/569; 427/571; 427/577; 427/78; 427/115; 427/255.6; 427/255.7
[58] Field of Search .................... 427/569, 571, 427/577, 78, 115, 255.6, 255.7; 204/192.14, 192.15; 429/44, 41, 40, 30

[56] References Cited

U.S. PATENT DOCUMENTS 5,518,831  5/1996  Tou et al. ..................... 429/42

Primary Examiner—Shrive Beck
Assistant Examiner—Timothy H. Meeks

[57] ABSTRACT

An electrode membrane assembly structure comprises a substrate, two active catalytic layers, each active catalytic layer consisting of micro-particle metal layer(s) and porous conducting layer(s) arranged alternately, and a solid polymer membrane layer being sandwiched in said two active catalytic layers and having protonic conductivity. And a method for manufacturing an electrode membrane assembly comprises the steps of forming an active catalytic layer comprising micro-particle metal layers and porous conducting layers on a substrate by plasma sputtering deposition and chemical vapor deposition (CVD), respectively; then forming a solid polymer membrane layer having protonic conductivity on said active catalytic layer by chemical vapor deposition; and followed by further forming another active catalytic layer on said solid polymer membrane layer, all under the condition of vacuum environment, to obtain the electrode membrane assembly.

11 Claims, 3 Drawing Sheets

ELECTRODE MEMBRANE ASSEMBLY AND METHOD FOR MANUFACTURING THE SAME

FIELD OF THE INVENTION

This invention relates to gas diffusion electrode membrane assembly and particularly, to a gas diffusion electrode comprising a substrate, an active catalytic layer consisted of metal micro-particle and porous conductive layers formed by plasma sputtering deposition and chemical vapor deposition (CVD), respectively, a solid polymer membrane layer, and an additional active catalytic layer. This invention also relates to a method for manufacturing the gas diffusion electrode membrane assembly.

BACKGROUND OF THE INVENTION

Conventional methods for manufacturing gas diffusion electrodes are mostly those for preparing an electrode having a thick film. In such conventional methods a polymer binder, such as a polymer suspension of Teflon series, is usually mixed with an active material, such as a metal catalyst of platinum particle on a carbon support, in an appropriate proportion, and the resulting mixture is deposited on a carrier to form a film by filtration or drying means, and the resulting film was transferred onto a gas diffusion structural backing layer having conductivity, such as carbon paper, carbon cloth, or the like, to construct a gas-diffusion electrode having semi-hydrophobic catalytic layer and a hydrophobic gas-diffusion layer.

Gas diffusion electrodes may be utilized in low-temperature type acidic fuel cells, e.g. the electrodes for phosphoric acid fuel cells and proton exchange membrane fuel cells, the working electrodes for electrochemical gas sensors, and the gas diffusion electrodes for electrochemical reactors.

In conventional methods for manufacturing an electrode having a thick film as described above, processing equipments are strictly required in precision so as to meet the requirements for the control of thickness and homogeneity of a film layer when in an industrial scale process. Among those, the design and manufacturing of the required equipments are the most critical issues and hence, skillful operation of the equipments is also demanded. As a result, such methods have disadvantages that the resulting Film layer is not homogeneous and is easily contaminated, and properties of the resulting thick film will vary with different operators such that a membrane with stable properties is difficult to be produced. Furthermore, in the aspect of the output of electricity, the thickness of a layer will affect properties such as electric conductivity and protonic conductivity. Especially, the interface properties between layers by using thick film process are not easily controlled, so that the surface resistance of such electrode is increased, and properties thereof such as electric conductivity and protonic conductivity, are accordingly adversely affected.

In view of the drawbacks of the conventional method for manufacturing an electrode having thick membrane, it is desirable to provide a multi-layer membrane electrode having stable properties.

OBJECT OF THE INVENTION

The primary object of the present invention is therefore to provide a gas diffusion electrode membrane assembly, which has thin film properties of improved proton and electron conductivities, and improved interface crosslinking structure between layers, as compared to the conventional electrode having thick film.

Another object of the present invention is to provide a method for manufacturing the gas diffusion electrode membrane assemblies, which can be conducted in a single vacuum chamber, and can be easily controlled.

DETAILED DESCRIPTION OF THE INVENTION

The present invention relates to a method for manufacturing electrode membrane assemblies, which comprises, in a vacuum chamber, forming an active catalytic layer consisting of micro-particle metal layer(s) and porous conductive layer(s) on a substrate by plasma sputtering deposition and chemical vapor deposition, respectively; then, on the active catalytic layer, forming a solid polymer membrane layer having the property of protonic conductivity; and then, further forming another active catalytic layer on the solid polymer membrane layer, to form the electrode membrane assembly according to the present invention.

The present invention further relates to an electrode membrane assembly comprising a substrate two active catalytic layers, each active catalytic layer consisting of micro-particle metal layer(s) and porous conductive layer(s) arranged alternately, and a solid polymer membrane layer being sandwiched in the two active catalytic layers and having protonic conductivity.

The electrode membrane assembly may be used as the gas diffusion electrode in the low-temperature type acidic fuel cell, or in electrochemical reactors, such as gas sensor, etc.

Specifically, the present invention relates to a process for manufacturing electrode membrane assemblies, which comprises steps of, in a vacuum environment of a single chamber, depositing a target metal on a substrate to form a micro-particle metal layer by plasma sputtering deposition, and then introducing a reactive gas into the chamber and forming a porous conductive layer on the micro-particle metal layer by plasma enhanced chemical vapor deposition, the step of forming a micro-particle metal layer and the step of forming a porous conductive layer being repeated several times, then, introducing another reactive gas into the chamber and forming a solid polymer membrane layer on the top of the final porous conducting layer by plasma enhanced chemical vapor deposition; and then, repeating the above-mentioned steps of forming a micro-particle metal layer and forming a porous conductive layer several times to form in turn micro-particle metal layer(s) and porous conductive layer(s). The electrode membrane assembly of the present invention is obtained.

Figure 1:
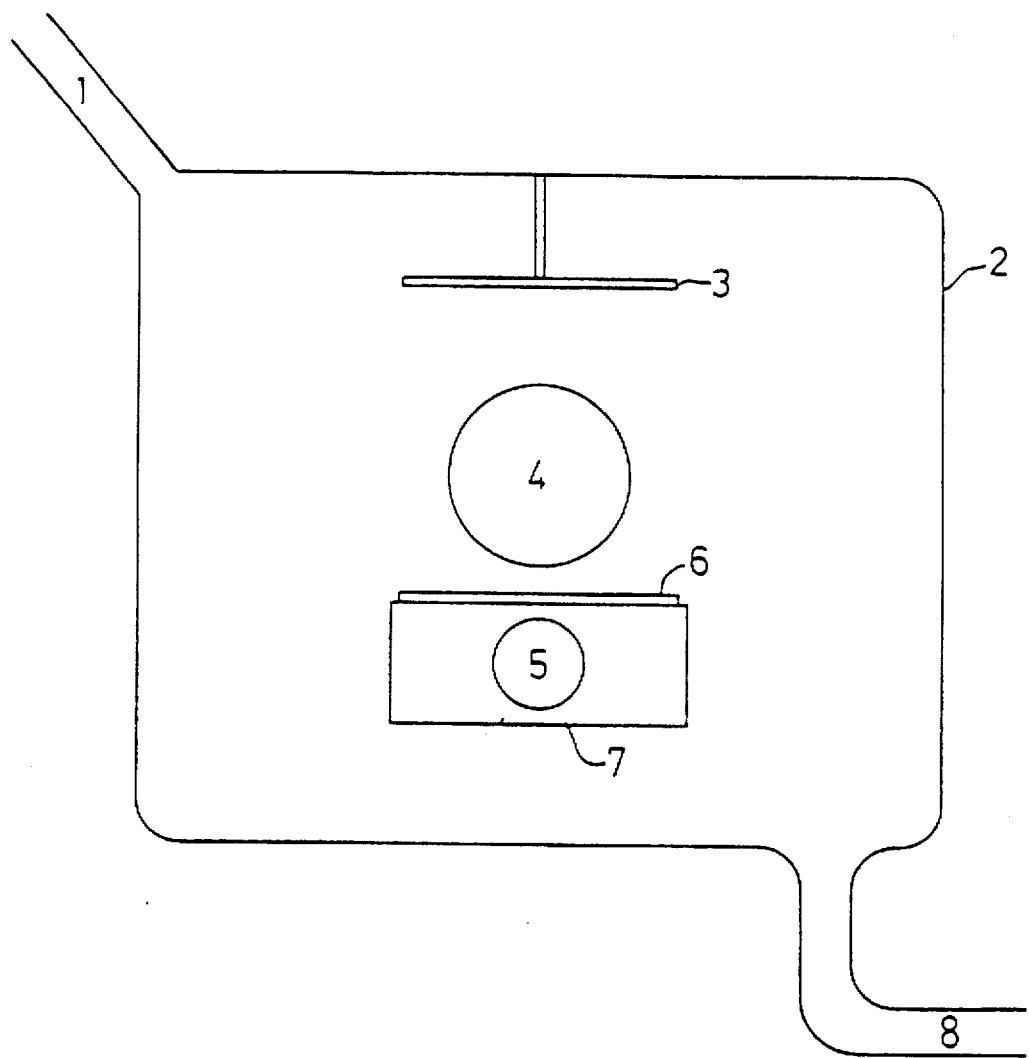
FIG. 1 is the schematic representation of the equipment for manufacturing the membrane electrode according to the present invention, wherein, 1 is a gas introduction conduit, 2 is a chamber, 3 is a substrate, 4 is plasma, 5 is a magnetic field-generating device 6 is a target, 7 is an electrode, and 8 is a gas-exhausting conduit.
Figure 2:
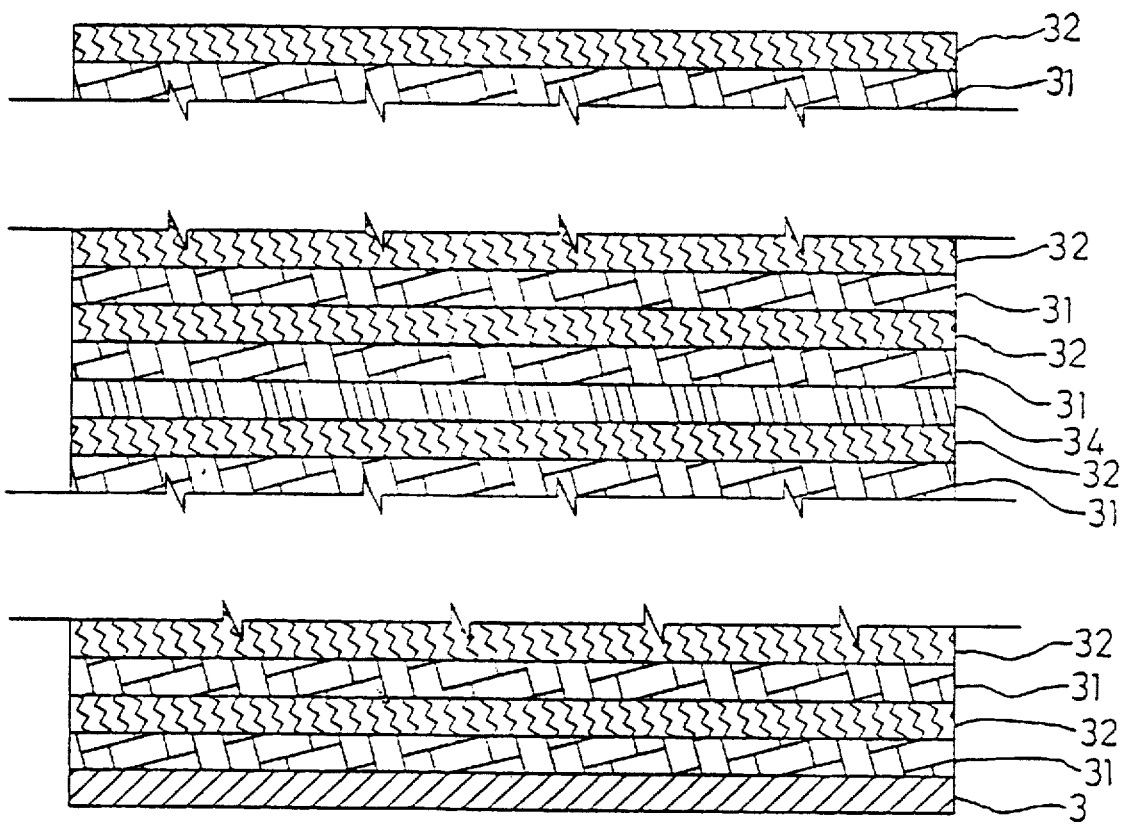
FIG. 2 is the cross-section schematic representation of the structure of the present invention, wherein 3 is the substrate, 31 is a microparticle metal layer formed by plasma sputtering deposition, 32 is a porous conducting layer formed by plasma enhanced chemical vapor deposition, and step C represents the step of forming a solid polymer membrane layer by plasma enhanced chemical vapor deposition.
Figure 3:
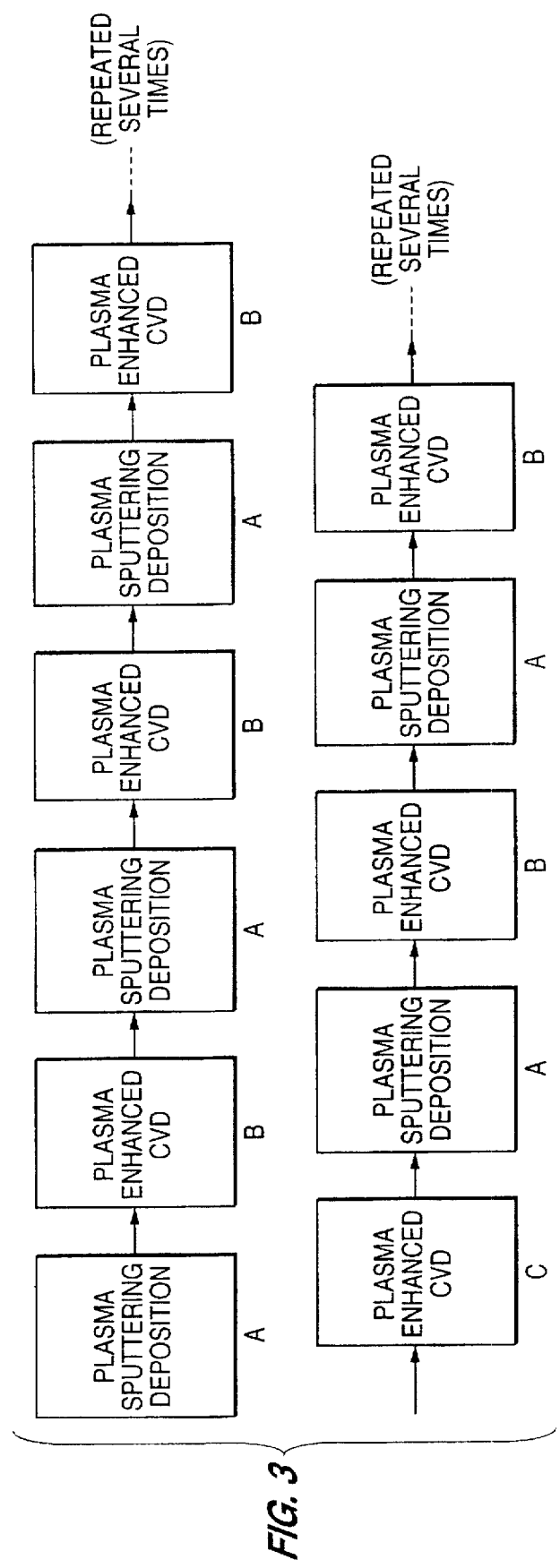
FIG. 3 is a chart showing the process of the present invention.

Now, referring to FIG. 1 to 3, the process of the present invention is described in detail as follows. In a chamber 2, there is placed a substrate 3, and a target 6 is placed on the top of the electrode 7 having a magnetic field-generating device 5 inside. The gas in the chamber is withdrawed via gas-exhausting conduit 8, and an argon gas is introduced into chamber 2 via gas-introducing conduit 1, and the pressure inside the chamber is maintained at $10^{-2}$ torr. The plasma 4 is generated by means of inputting energy of high voltage or high frequency to electrode 7. The target metal is sputtering-deposited on the substrate to form micro-particle metal layer 31. Subsequently, the reactive gas is introduced into the chamber via conduit 1 while the chamber is vacuumed via gas-exhausting conduit 8 to maintain the pressure inside the chamber at $10^{-2}$ torr, and the porous conductive layer 32 is deposited on the micro-particle metal layer 31 by plasma enhanced chemical vapor deposition. The formation of micro-particle metal layer 31 and porous conductive layer 32 may be repeated several times. After that, another reactive gas is introduced into the chamber via conduit 1 while the chamber is evacuated via gas-exhausting conduit 8 to maintain the pressure inside the chamber at $10^{-2}$ torr. A solid polymer membrane layer 34 is formed on the porous conductive layer 32 by plasma enhanced CVD. Further, the micro-particle metal layer 31 and porous conductive 32 are formed on the solid polymer membrane layer 34 as described above.

The micro-particle metal layer and the porous conductive layer are together used as an active catalytic layer, and the solid polymer membrane layer is used as an electrolyte and separator layer having property of proton conductivity. Therefore, a sandwich structure of active catalytic layer-electrolyte layer-active catalytic layer on a substrate is thus obtained, i.e. a multi-layer membrane electrode consisting of a substrate, two active catalytic layers and an electrolyte layer possitioned between the two active catalytic layers, as shown in FIG. 2.

The plasma used in the present invention may be the DC plasma generated by DC power or microwave plasma wherein gas is ionized by microwave. Microwave for generating microwave plasma is selected from high frequency (RF) or medium frequency (MF) based on different frequencies and thus it is an easily controllable parameter. Also, the present invention may use magnetron plasma in which the area where the plasma exists is confined with magnetic field to let the working energy be concentrated at certain area. Magnetron plasma is preferred because the plasma may be confined in the area needed, therefore the material used for deposition will not be wasted, the sputtering rate is higher and the vacuum chamber is cleaner than that used in the manner of common plasma sputtering deposition.

One of two deposition methods used in the present-invention is plasma sputtering deposition which is a physical vapor deposition technique, wherein the atoms or electrons emit from a target by the way that a portion of ions of plasma are accelerated and the accelerated ions bombard the target, and then transfer to the surface of a substrate to form adsorbates. The other deposition methods used in the present invention is plasma enhanced chemical vapor deposition (PECVD), in which the introduced gas reactant(s) is (are) reacted (such as polymerized) by plasma to form and deposit solid product on the substrate. In the present invention, the active catalytic layer and the electrolyte layer of the membrane electrodes may be manufactured in a single chamber under a vacuum condition by using these two deposition methods as described above to give the multi-layer membrane structure having crosslinked interfaces.

The substrates used as structural back layer in the present invention is not particularly limited as long as the material having electric conductivity and gas diffusion ability, such as carbon paper, carbon cloth, etc.

In the step for forming micro-particle metal layer by plasma sputtering deposition according to the present invention, the target material used is the catalytic metal needed for the desired gas diffusion electrode. The metal or alloy with the ability to form a micro-particle metal layer having metal particle size of 10~100 Å may be useful in the present invention due to the fact that the increased surface area increases the reaction rate. The metal or alloy may also be selected from different active catalytic materials depending on the different chemical reactions among the reactants and the electrode material in the application of the electrode of the present invention to fuel cells, electrochemical reactors, and sensors. For example, in the application to fuel cells, the metal used is mainly Pt or the alloy of Pt with one or more metals selected from the group consisting of gold, the metals of Group VB (such as V, Nb, Ta), the metals of Group VIII (such as Fe, Co, Ni, Ru, Rh, Pd, Os, Ir), the metals of Group VII B (such as Mn, Tc, Re), and the metals of Group VI B (such as Cr, Mo, W) of the periodic table. In the application to sensors, the metal used may be other metal or alloy, for example, the metal of Group I B of the periodic table or the alloy of silver. Under the vacuum level of $10^{-1}$–$10^{-4}$ torr, direct current power source of hundreds mA and hundreds KV or high or medium frequency power source having 13.6 KHz or 400 MHz, respectively, is used to produce the micro-particle metal layer having particle size of 10–100 Å, while, the thickness of the film is controlled by controlling reaction time.

In the step for forming the porous conductive layer by PECVD as described above, the reactive gas Introduced may be, for example, hydrocarbon compound. The thickness of the membrane is controlled at from tens Å to hundreds Å depending on the reaction time. The resulting layer, a porous carbonaceous layer, has the function of gas diffusion and electric conductivity. The flow rate of reactive gas is varied depending on the given condition.

In the step for forming the electrolyte layer, i.e. solid polymer membrane layer, by PECVD as described above, the reactive gases used are, for example, fluorocarbon and trifluoromethyl sulfonic acid, and such reactive gases and vapor are formed into solid polymer membrane layer having protonic conductivity (i.e. proton exchange membrane, such as Nafion) by plasma enhanced polymerization.

The plasma sputtering deposition procedure for manufacturing the micro-particle metal layer and the plasma enhanced chemical vapor deposition procedure for manufacturing the porous conductive layer may be also conducted simultaneously or may be conducted alternatively under the magnetron plasma condition, as such called reactive sputtering. The obtained layer is the metal particulate-containing porous conducting film as the active catalytic layer. This membrane is the hybrid layer of layers 31 and 32.

The structure of electrode membrane assembly obtained by the method according to the present invention has better properties of protonic and electric conductivity, and also has better structure of interface crosslinkage between layers. For the method according to the present invention, there are advantages that the process is conducted in a single reactor, the contamination between the layer structure of electrode is reduced due to the process is conducted under a vacuum condition, and the quality of product prepared during the process is to be easier controlled by controlling the physical factors, compared to the conventional method for preparing an electrode having a thick film.

For the structure of the membrane electrode and the method for preparing the same in accordance with present invention, the reaction conditions, such as the kinds of plasma or magnetron plasma, substrate, target material and reactive gas, reaction time, flow rate of a reactive gas, reaction temperature and pressure, thickness of membrane, the number of membrane layers, particle size of the metal layer, etc. may be varied and modified by those skilled in the art without departure the spirit and scope of the present invention. The embodiment described below further illustrates the present invention, but should not be construed to the scope of the present invention.

EMBODIMENT

[The preparation of the electrode membrane assembly of the present invention]

The procedures for preparing the electrode membrane assembly were as follow:

1. A water-proofing carbon paper (manufactured by Toray Co.) pretreated by impregnating with a Teflon solution was used as a substrate for the deposition layers of the membrane electrode and placed in a chamber.
2. A argon gas was introduced into the chamber at a flow rate of 30 cc/min by using mass flow rate controller, while maintaining the pressure inside the chamber at $10^{-2}$ torr by pumping system, a plasma was generated by applying the DC power of 1000–1300 V (or radio frequency of 400 MHz, power of 100 Watts). Within the magnetron plasma area, the target material of platinum metal was sputtered and deposited on the substrate described above, to form a microparticle metal layer having metal particle size of 10–100 Å. Then, tetramethyl-disiloxane vapor was introduced into the chamber and a carbonaceous porous conducting layer was formed on the micro-particle metal layer by plasma enhanced chemical vapor deposition. The micro-particle metal layer and the porous conducting layer were together used as the active catalytic layer.
3. These two deposition methods in step 2 were repeated to form an active catalytic layer including micro-particle metal layer(s) and porous conducting layer(s).
4. Under maintaining the vacuum level at $10^{-2}$ torr, TFCE (halocarbon 1113) fluorocarbon gas was introduced through a container containing trifluoromethyl sulfonic acid and then entered into the chamber along with the trifluoromethyl sulfonic acid vapor. These two ingredients were subjected to plasma enhanced polymerization to form the solid polymer membrane layer having the property of protonic conductivity.
5. After the solid polymer membrane layer as described above was formed, the step 2 was repeated to form another active catalytic layer on the solid polymer membrane layer, and the electrode membrane assembly having the structure of substrate-catalytic layer-electrolyte layer-catalytic layer according to the present invention was obtained. The electrode membrane assembly may be used as a single fuel cell.

What is claimed is:

1. A method for manufacturing an electrode membrane assembly, comprising conducting the following steps on a gas diffusible and electrically conductive substrate:

(A) forming a micro-particle metal layer on said substrate in a vacuum chamber by plasma sputtering deposition, then, (B) introducing a first reactive gas into the vacuum chamber and forming a porous electrically conductive layer on said micro-particle metal layer by plasma enhanced chemical vapor deposition.

wherein steps (A) and (B) are conducted at least one time to form an active catalytic layer comprising micro-particle metal layer(s) and porous electrically conducting layer(s);

(C) introducing a second reactive gas into said vacuum chamber and forming a solid polymer membrane layer as electrolyte layer on said active catalytic layer by plasma enhanced chemical vapor deposition; and (D) subsequently on said solid polymer membrane layer, repeating steps (A) and (B) at least one time to form another active catalytic layer comprising micro-particle metal layer(s) and porous electrically conducting layer (s) to give the electrode assembly.

2. The method according to claim 1 wherein said micro-particle metal layer is formed by magnetron plasma sputtering deposition.

3. The method according to claim 1, wherein said porous electrically conducting layer is formed by magnetron plasma enhanced chemical vapor deposition.

4. The method according to claim 1, wherein said solid polymer membrane layer is formed by magnetron plasma enhanced chemical vapor deposition.

5. The method according to claim 1, wherein said substrate is carbon paper or carbon cloth.

6. The method according to claim 1, wherein the metal used for forming said micro-particle metal layer is platinum or an alloy thereof.

7. The method according to claim 6, wherein said alloy is an alloy of platinum with one or more metals selected from the group consisting of gold, the metals of Group VB, the metals of Group VIII, the metals of Group VII B, and the metals of Group VI B of the periodic table.

8. The method according to claim 1, wherein said first reactive gas introduced in step (B) is a hydrocarbon compound.

9. The method according to claim 1, wherein said second reactive gas introduced In step(C) is a fluorocarbon compound with trifluoromethyl sulfonic acid.

10. The method according to claim 1, wherein step(A) and step(B) are simultaneously conducted to form a mental particulate-containing porous electrically conducting membrane as the active catalytic layer.

11. The method according to claim 10, wherein the plasma sputtering deposition and plasma enhanced chemical vapor deposition are magnetron plasma type.

* * * * *